United States Patent
Kato et al.

(10) Patent No.: US 7,462,376 B2
(45) Date of Patent: *Dec. 9, 2008

(54) CVD METHOD FOR FORMING SILICON NITRIDE FILM

(75) Inventors: Hitoshi Kato, Tokyo (JP); Kohei Fukushima, Tokyo (JP); Masato Yonezawa, Tokyo (JP); Junya Hiraka, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 59 days.

This patent is subject to a terminal disclaimer.

(21) Appl. No.: 10/558,217

(22) PCT Filed: May 21, 2004

(86) PCT No.: PCT/JP2004/007311

§ 371 (c)(1),
(2), (4) Date: Nov. 23, 2005

(87) PCT Pub. No.: WO2004/105115

PCT Pub. Date: Dec. 2, 2004

(65) Prior Publication Data

US 2006/0286817 A1    Dec. 21, 2006

(30) Foreign Application Priority Data

May 26, 2003  (JP)  .............................. 2003-148332
Feb. 20, 2004  (JP)  .............................. 2004-045508

(51) Int. Cl.
C23C 16/34  (2006.01)

(52) U.S. Cl. ..................... 427/255.393; 427/255.394

(58) Field of Classification Search .......... 427/255.393, 427/255.394, 579
See application file for complete search history.

(56) References Cited

U.S. PATENT DOCUMENTS

| 4,091,169 | A | * | 5/1978 | Bohg et al. | .................. 428/428 |
| 4,158,717 | A | * | 6/1979 | Nelson | ...................... 428/446 |
| 4,395,438 | A | * | 7/1983 | Chiang | ...................... 438/791 |
| 4,699,825 | A | * | 10/1987 | Sakai et al. | .................. 428/337 |
| 5,052,339 | A | * | 10/1991 | Vakerlis et al. | ........... 118/723 E |
| 5,562,952 | A | * | 10/1996 | Nakahigashi et al. | ....... 427/534 |

(Continued)

FOREIGN PATENT DOCUMENTS

JP    1-195277    8/1989

(Continued)

OTHER PUBLICATIONS

Liu, Xuejian, et al., "Chemical vapor deposition of silicon nitride thin films from tris(diethylamino)chlorosilane". Materials Letters vol. 59, Issue 1, Jan. 2005, pp. 11-14.*

*Primary Examiner*—Bret Chen
(74) *Attorney, Agent, or Firm*—Oblon, Spivak, McClelland, Maier & Neustadt, P.C.

(57) ABSTRACT

A CVD method for forming a silicon nitride film includes exhausting a process chamber (8) that accommodates a target substrate (W), and supplying a silane family gas (HCD) and ammonia gas ($NH_3$) into the process chamber, thereby forming a silicon nitride film on the target substrate by CVD. Said forming a silicon nitride film on the target substrate alternately includes a first period of performing supply of the silane family gas (HCD) into the process chamber (8), and a second period of stopping supply of the silane family gas.

12 Claims, 8 Drawing Sheets

U.S. PATENT DOCUMENTS

| | | | | |
|---|---|---|---|---|
| 5,874,368 | A * | 2/1999 | Laxman et al. | 438/794 |
| 5,932,286 | A * | 8/1999 | Beinglass et al. | 427/255.18 |
| 6,391,803 | B1 * | 5/2002 | Kim et al. | 438/787 |
| 6,504,233 | B1 * | 1/2003 | Gorczyca et al. | 257/629 |
| 6,638,879 | B2 * | 10/2003 | Hsieh et al. | 438/791 |
| 6,686,271 | B2 * | 2/2004 | Raaijmakers et al. | 438/633 |
| 6,844,273 | B2 * | 1/2005 | Kato et al. | 438/791 |
| 7,094,708 | B2 * | 8/2006 | Kato et al. | 438/778 |
| 7,156,923 | B2 * | 1/2007 | Kato et al. | 118/715 |
| 7,351,668 | B2 * | 4/2008 | Chou et al. | 438/770 |
| 2002/0058107 | A1 * | 5/2002 | Fareed et al. | 427/255.39 |
| 2006/0019032 | A1 * | 1/2006 | Wang et al. | 427/248.1 |
| 2006/0182885 | A1 * | 8/2006 | Lei et al. | 427/248.1 |
| 2008/0063791 | A1 * | 3/2008 | Hasebe et al. | 427/96.8 |

FOREIGN PATENT DOCUMENTS

| | | |
|---|---|---|
| JP | 2-93071 | 4/1990 |
| JP | 4-42931 | 2/1992 |
| JP | 6-275608 | 9/1994 |
| JP | 2001-168092 | 6/2001 |
| JP | 2002-305242 | 10/2002 |

* cited by examiner

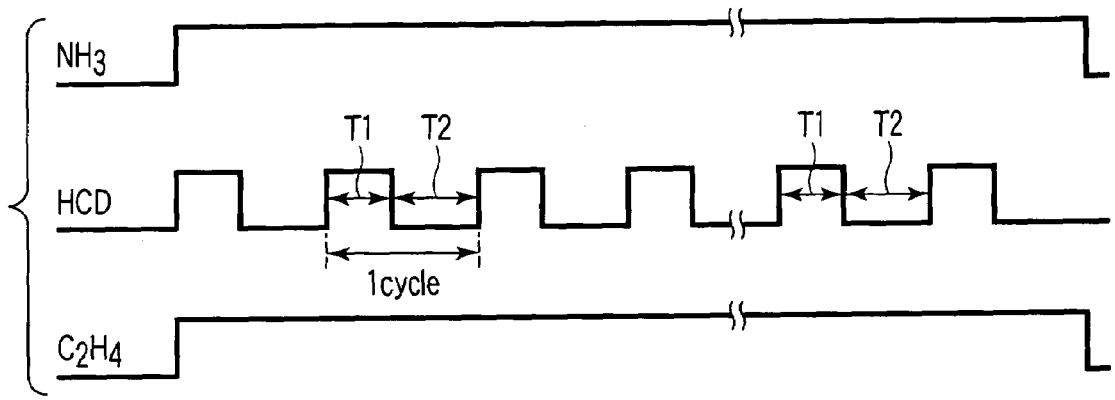
F I G. 2A
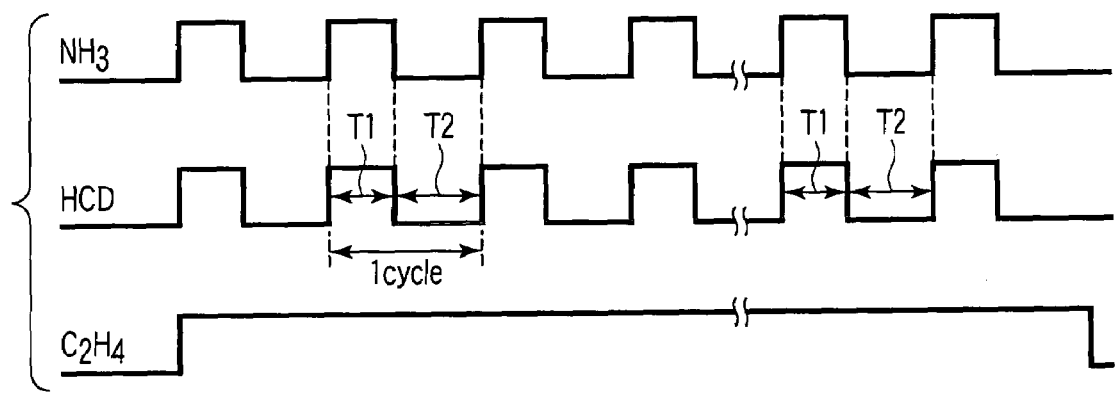
F I G. 2B
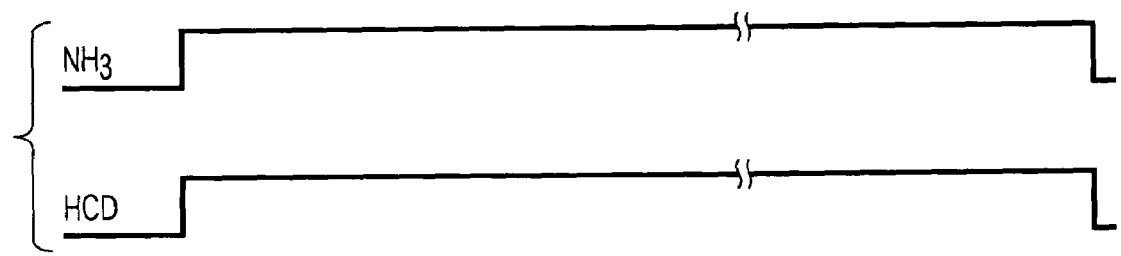
F I G. 2C

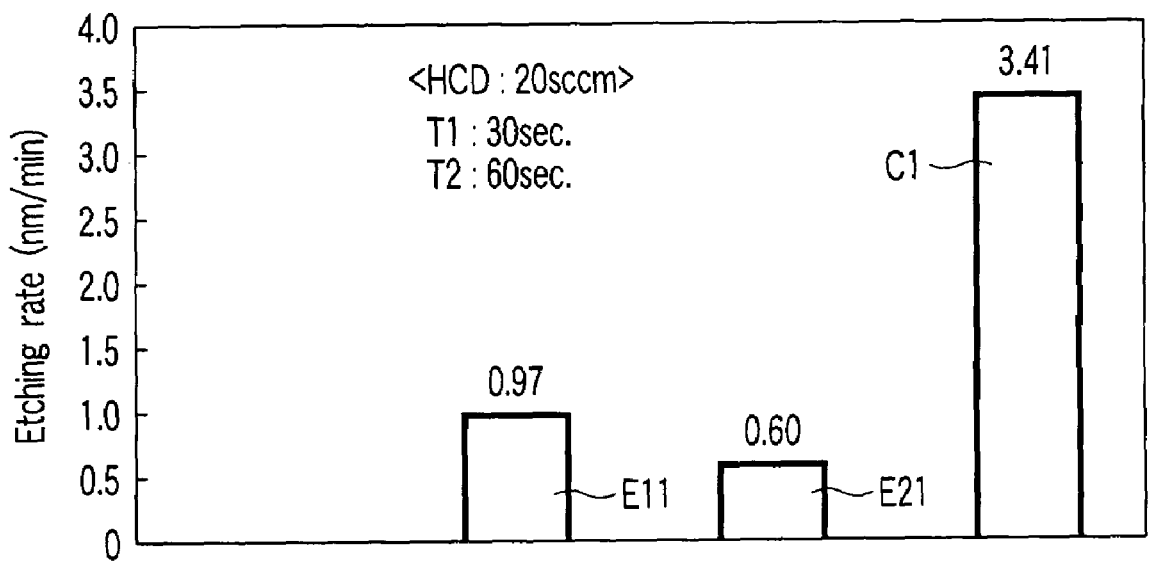
F I G. 3A
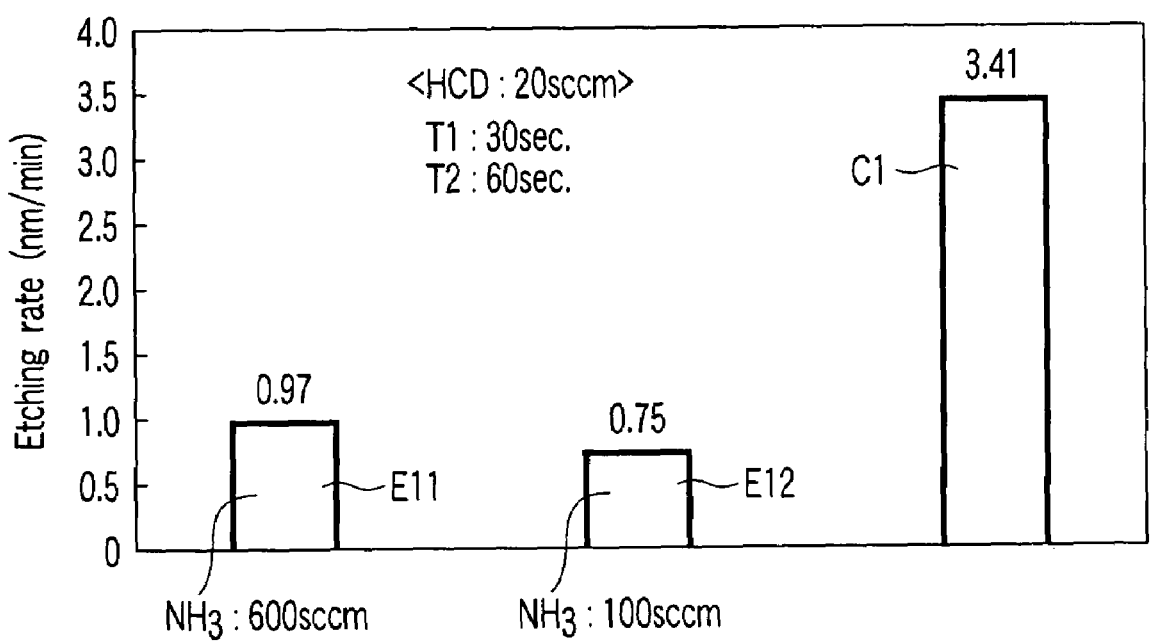
F I G. 3B

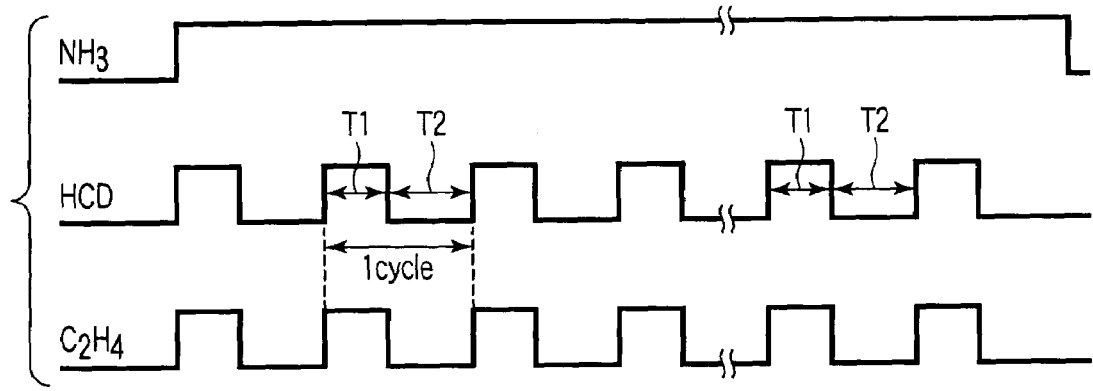
F I G. 4A
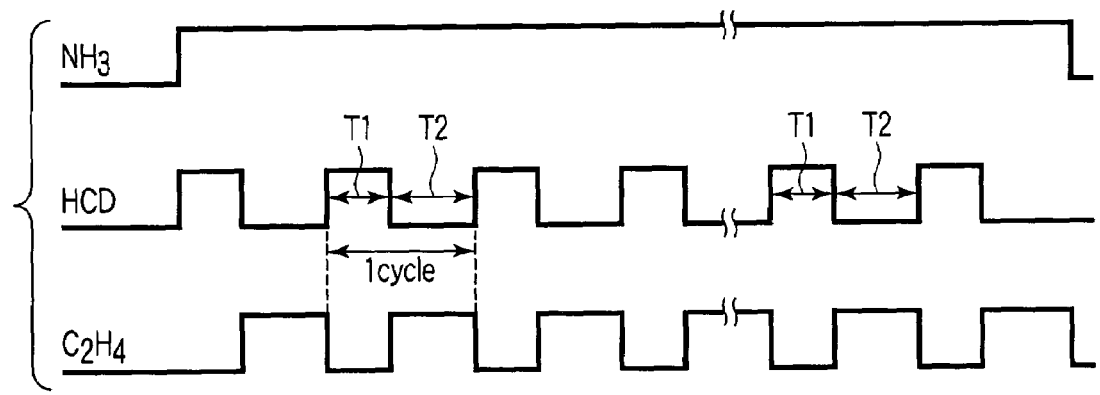
F I G. 4B
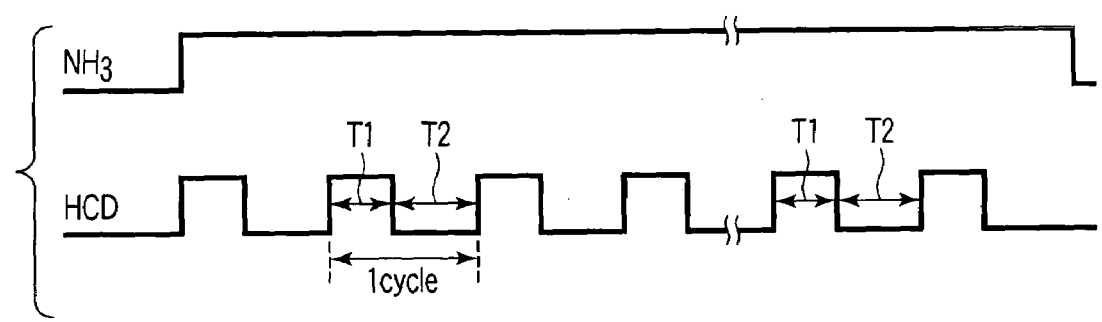
F I G. 5

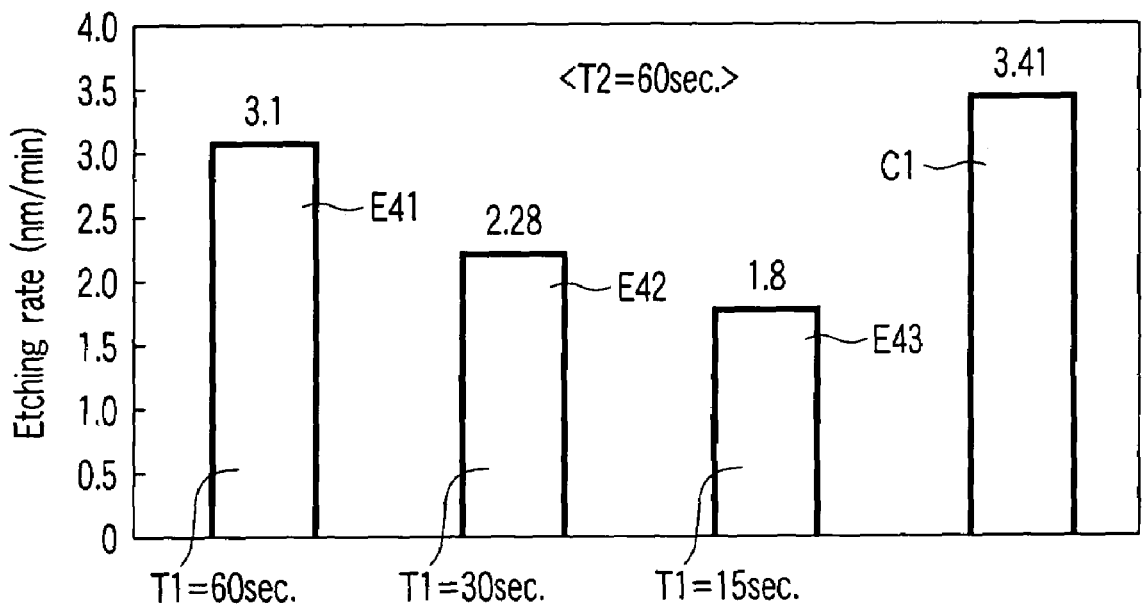
F I G. 6A
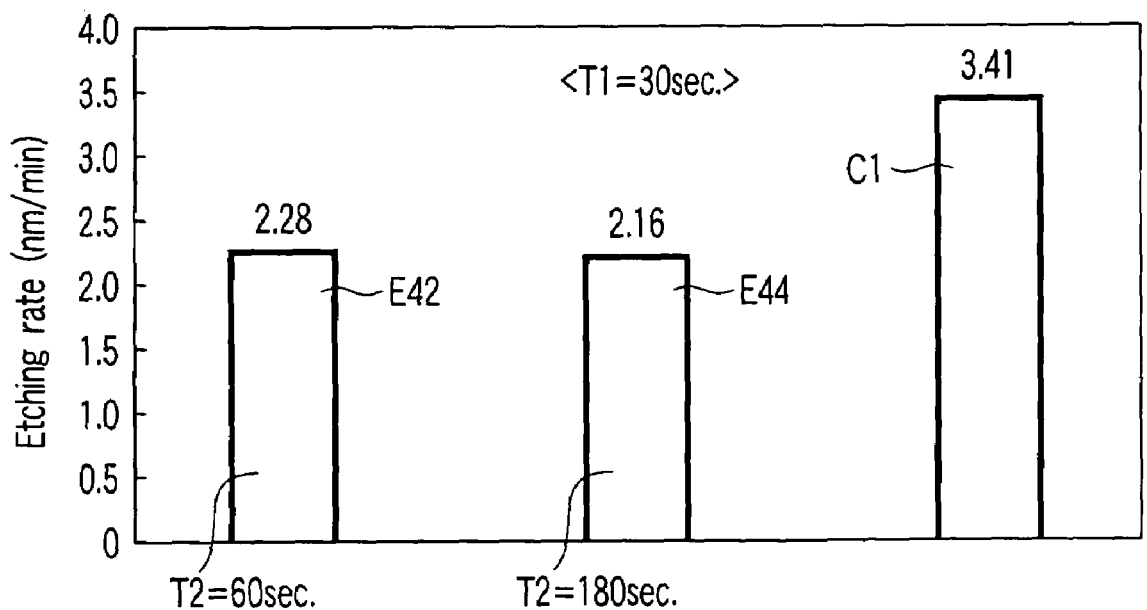
F I G. 6B

CVD METHOD FOR FORMING SILICON NITRIDE FILM

TECHNICAL FIELD

The present invention relates to a CVD method and apparatus for forming a silicon nitride film on a target substrate, used in a semiconductor process.

BACKGROUND ART

Semiconductor devices include insulating films made of a material, such as $SiO_2$, PSG (Phospho Silicate Glass), P—SiO (formed by plasma CVD), P—SiN (formed by plasma CVD), SOG (Spin On Glass), $Si_3N_4$ (silicon nitride), etc. Particularly, silicon nitride films are widely used, because they have better insulation properties as compared to silicon oxide films, and they can sufficiently server as etching stopper films.

Some methods are known of forming a silicon nitride film on the surface of a semiconductor wafer by thermal CVD (Chemical Vapor Deposition). In such thermal CVD, a silane family gas, such as monosilane ($SiH_4$), dichlorosilane (DCS: $SiH_2Cl_2$), hexachlorodisilane (HCD: $Si_2Cl_6$), or bistertialbutylaminosilane (BTBAS: $SiH_2(NH(C_4H_9)_2)$, is used as a silicon source gas. For example, a silicon nitride film is formed by thermal CVD using a gas combination of $SiH_2Cl_2+NH_3$ (see Jpn. Pat. Appln. KOKAI Publication No. 2-93071) or $Si_2Cl_6+NH_3$.

Owing to the demands of increased miniaturization and integration of semiconductor integrated circuits, insulating films as those described above need to be made thinner. Furthermore, in order to maintain the electric properties of the various films that lie below insulating films, the temperature used in thermal CVD in forming the insulating films needs to be lowered. In this respect, for example, where a silicon nitride film is deposited by thermal CVD, a high process temperature of about 760° C. is conventionally used. In recent years, where a silicon nitride film is deposited by thermal CVD, a process temperature of about 600° C. is used, as the case may be.

Where semiconductor devices are fabricated, conductive films and insulating films as described above are stacked one on the other, and are subjected to pattern etching to form a multi-layer structure. When an insulating film is formed and then another thin film is formed thereon, contaminants such as organic substances and particles may have stuck to the surface of the insulating film. Accordingly, a cleaning process is performed to remove the contaminants, as needed. In this cleaning process, the semiconductor wafer is immersed in a cleaning solution, such as dilute hydrofluoric acid, to perform etching on the surface of the insulating film. Consequently, the surface of the insulating film is etched by a very small amount, thereby removing the contaminants.

Where such an insulating film is formed by CVD at a higher process temperature of, e.g., about 760° C., the etching rate of the insulating film during the cleaning process is very small. Accordingly, the insulating film is not excessively etched by cleaning, and thus the cleaning process is performed with high controllability in the film thickness. On the other hand, where such an insulating film is formed by CVD at a lower process temperature of, e.g., about 600° C., the etching rate of the insulating film during the cleaning process is relatively large. Accordingly, the insulating film may be excessively etched by cleaning, and thus the cleaning process entails lower controllability in the film thickness.

Further, a silicon nitride film may be used as an etching stopper film. In this case, the silicon nitride film is required to have a very small etching rate. However, the conventional film formation method cannot satisfy this requirement.

DISCLOSURE OF INVENTION

An object of the present invention is to provide a method and apparatus for forming a silicon nitride film, which can employ a relatively low process temperature of film formation, and cause the silicon nitride film to have a low etching rate during a cleaning process, so that the cleaning process can be performed with high controllability in the film thickness of the silicon nitride film, while allowing the silicon nitride film to sufficiently serve as an etching stopper film.

According to a first aspect of the present invention, there is provided a CVD method for forming a silicon nitride film, comprising:

exhausting a process chamber that accommodates a target substrate, and supplying a silane family gas and ammonia gas into the process chamber, thereby forming a silicon nitride film on the target substrate by CVD, wherein said forming a silicon nitride film on the target substrate alternately comprises a first period of performing supply of the silane family gas into the process chamber, and a second period of stopping supply of the silane family gas.

According to a second aspect of the present invention, there is provided a CVD method for forming a silicon nitride film, comprising:

exhausting a process chamber that accommodates a target substrate, and supplying a silane family gas, ammonia gas, and a carbon hydride gas into the process chamber, thereby forming a silicon nitride film on the target substrate by CVD, wherein said forming a silicon nitride film on the target substrate alternately comprises a first period of performing supply of the silane family gas into the process chamber, and a second period of stopping supply of the silane family gas.

In the first and second aspects, the first period may have a length not more than that of the second period. For example, the first period is set to have a length within a range of 15 to 60 seconds, and the second period is set to have a length within a range of 30 to 180 seconds.

In the first and second aspects, said forming a silicon nitride film alternately may comprise a third period of performing supply of the ammonia gas into the process chamber, and a fourth period of stopping supply of the ammonia gas.

In the second aspect, said forming a silicon nitride film may alternately comprise a third period of performing supply of the ammonia gas into the process chamber, and a fourth period of stopping supply of the ammonia gas, and alternately comprise a fifth period of performing supply of the carbon hydride gas into the process chamber, and a sixth period of stopping supply of the carbon hydride gas. Where the target substrate comprises a silicon surface, said forming a silicon nitride film is preferably arranged to first perform supply of at least one of the silane family gas and the carbon hydride gas.

BRIEF DESCRIPTION OF DRAWINGS

FIGS. 2A, 2B, and 2C are timing charts showing gas supply patterns according to first and second embodiments of the present invention and a prior art, respectively;

FIG. 3A is a graph showing the dependency of the etching rate of a silicon nitride film on the gas supply pattern, in relation to the first and second embodiments;

FIG. 3B is a graph showing the dependency of the etching rate of a silicon nitride film on the NH$_3$ gas flow rate, in relation to the first embodiment;

FIGS. 4A and 4B are timing charts showing gas supply patterns according to a third embodiment of the present invention and a modification thereof, respectively;

FIG. 5 is a timing chart showing a gas supply pattern according to a fourth embodiment of the present invention;

FIG. 6A is a graph showing the dependency of the etching rate of a silicon nitride film on the length of the deposition period, in relation to the fourth embodiment;

FIG. 6B is a graph showing the dependency of the etching rate of a silicon nitride film on the length of the reformation period, in relation to the fourth embodiment;

BEST MODE FOR CARRYING OUT THE INVENTION

Figure 1:
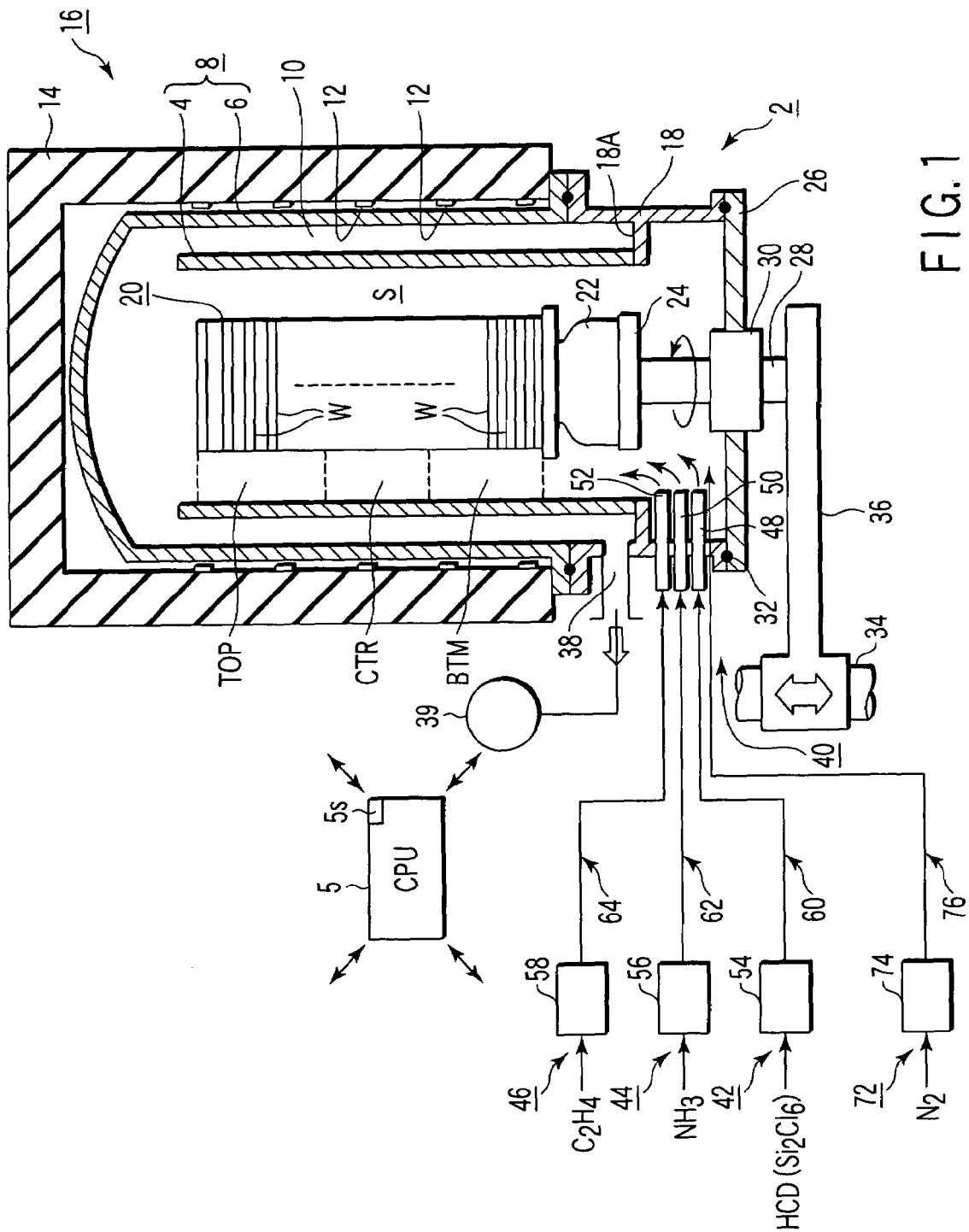
FIG. 1 is a sectional view showing a CVD apparatus according to an embodiment of the present invention.

In the process of developing the present invention, the inventors studied the etching rate of a silicon nitride film during cleaning processes. As a result, the inventors have arrived at the findings given below. Specifically, where a silicon nitride film is caused to positively contain carbon components, the etching rate of the film becomes smaller during cleaning processes. Further, without reference to the presence and absence of carbon components, where a silane family gas, which is a silicon source gas for a silicon nitride film, is intermittently supplied, the etching rate of the film becomes smaller during cleaning processes. It should be noted that the present invention is an improved version of the invention disclosed in Jpn. Pat. Appln. KOKAI Publication No. 2003-282566 (Oct. 3, 2003).

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

First Embodiment

FIG. 1 is a sectional view showing a CVD apparatus according to an embodiment of the present invention. This CVD apparatus 2 is arranged to supply a first gas consisting essentially of a silane family gas (silicon source gas), a second gas consisting essentially of nitriding gas, and a third gas consisting essentially of a carbon hydride gas together, so as to form a silicon nitride film. For example, when hexachlorodisilane (HCD: Si$_2$Cl$_6$) and NH$_3$ are used to deposit a silicon nitride film, a carbon hydride gas is supplied to make the film contain carbon components.

As shown in FIG. 1, this CVD apparatus 2 includes a process container 8 having a double tube structure, which is formed of an inner tube 4 and an outer tube 6. The inner tube 4 and outer tube 6 are formed of cylindrical quartz bodies, and disposed concentrically with each other with a predetermined gap 10 therebetween. The process container 8 is surrounded by a heating cover 16, which includes heating means 12, such as a heater, and a thermal insulator 14. The heating means 12 is disposed over the entire inner surface of thermal insulator 14. In this embodiment, the inner tube 4 of the process chamber 8 has an inner diameter of about 240 mm, and a height of about 1,300 mm, and the process chamber 8 has a volume of about 110 liters.

The bottom of the process container 8 is supported by a cylindrical manifold 18 made of, e.g., stainless steel. A ring support plate 18A extends inward from the inner wall of the manifold 18 and supports the bottom of the inner tube 4. A wafer boat 20 made of quartz is moved up and down through the bottom port of the manifold 18, so that the wafer boat 20 is loaded/unloaded into and from the process container 8. A number of target substrates or semiconductor wafers W are stacked on a wafer boat 20. For example, in this embodiment, the wafer boat 20 can support 100 to 150 wafers having a diameter of 200 mm at essentially regular intervals in the vertical direction. The size and accommodation number of wafers W are not limited to this example. For example, this embodiment may be modified for wafers having a diameter of 300 mm.

The wafer boat 20 is placed on a rotary table 24 through a heat-insulating cylinder 22 made of quartz. The rotary table 24 is supported by a rotary shaft 28, which penetrates a lid 26 used for opening/closing the bottom port of the manifold 18. The portion of the lid 26 where the rotary shaft 28 penetrates is provided with, e.g., a magnetic-fluid seal 30, so that the rotary shaft 28 is rotatably supported in an airtightly sealed state. A seal member 32, such as an O-ring, is interposed between the periphery of the lid 26 and the bottom of the manifold 18, so that the interior of the process container 8 can be kept sealed.

The rotary shaft 28 is attached at the distal end of an arm 36 supported by an elevating mechanism 34, such as a boat elevator. The elevating mechanism 34 moves the wafer boat 20 and lid 26 up and down integratedly. An exhaust port 38 is formed in the side of the manifold 18 to exhaust the atmosphere in the process container 8 through the bottom of the gap 10 between the inner tube 4 and outer tube 6. The exhaust port 38 is connected to a vacuum exhaust section 39 including a vacuum pump and so forth.

A gas supply section 40 is connected to the side of the manifold 18 to supply predetermined process gases into the inner tube 4. More specifically, the gas supply section 40 includes a silane family gas supply circuit 42, a nitriding gas supply circuit 44, and a carbon hydride gas supply circuit 46. The gas supply circuits 42, 44, and 46 have linear gas nozzles 48, 50, and 52, respectively, which penetrate the side of the manifold 18.

The gas nozzles 48, 50, and 52 are respectively connected to gas passages 60, 62, and 64, which are provided with flow rate controllers 54, 56, and 58, such as mass-flow controllers. The gas passages 60, 62, and 64 are configured to supply the silane family gas, nitriding gas, carbon hydride gas, respectively, at controlled flow rates. For example, the silane family gas (silicon source gas) is HCD gas, the nitriding gas is NH$_3$ gas, and the carbon hydride gas is ethylene (C$_2$H$_4$) gas.

The gas supply section 40 further includes a purge gas supply circuit 72 for supplying a purge gas. The purge gas supply circuit 72 is connected to the side of the manifold 18 through a gas passage 76 provided with a flow rate controller 74, such as a mass-flow controller. For example, the purge gas is an inactive gas, such as $N_2$.

Next, an explanation will be given of CVD methods according to embodiments of the present invention, performed in the apparatus described above. Each of the following methods (including gas supply and stop) can be performed in accordance with the process recipe of a CVD process concerning, e.g., the film thickness of a silicon nitride film to be formed, stored in a memory 5s of a CPU 5 in advance. In the memory 5s, the relationship between the process gas flow rates and the thickness of the silicon nitride film is also stored as control data in advance. Accordingly, the CPU 5 can control the gas supply section 40 and so forth based on the stored process recipe and control data.

At first, when the CVD apparatus is in a waiting state with no wafer boat loaded therein, the interior of the process container 8 is kept at a process temperature of, e.g., about 500° C. On the other hand, a number of wafers, e.g. 100 wafers W, are transferred onto the wafer boat 20 at a normal temperature, which is then loaded into the process container 8 from below. Then, the bottom port of the manifold 18 is closed by the lid 26 to airtightly seal the interior of the process container 8.

Then, the interior of the process container 8 is vacuum exhausted to a predetermined process pressure, and the wafer temperature is increased to a process temperature for film formation. After the temperature is stabilized, as predetermined, HCD gas used as a silane family gas, ammonia gas used as a nitriding gas, and ethylene gas used as a carbon hydride gas are supplied from the respective nozzles 48, 50, and 52 of the gas supply section 40 at controlled flow rates. At this time, a silicon nitride film is formed, while using a gas supply pattern according to an embodiment, as described below.

First and Second Embodiments

FIGS. 2A, 2B, and 2C are timing charts showing gas supply patterns according to first and second embodiments of the present invention and a prior art, respectively. As shown in FIGS. 2A and 2B, a HCD gas used as a silane family gas is not continuously supplied, but intermittently supplied, i.e., repeating start and stop of the supply. Specifically, according to the first embodiment, as shown in FIG. 2A, $NH_3$ gas and $C_2H_4$ gas are continuously supplied. According to the second embodiment, as shown in FIG. 2B, $C_2H_4$ gas is continuously supplied, while $NH_3$ gas is intermittently supplied in synchronism with the HCD gas. In the first and second embodiments, during one simultaneous supply period (deposition period) T1 of simultaneously supplying HCD gas and $NH_3$ gas, a silicon nitride film containing carbon is deposited on the surface of wafers W. Further, during one recess period (reformation period) T2 of stopping supply of HCD gas, the silicon nitride film deposited immediately before is reformed.

Specifically, the deposition period T1 and reformation period T2 are alternately repeated to stack silicon nitride films containing carbon. One cycle is defined to include one deposition period T1 and one reformation period T2, and the number of cycles is determined in accordance with a target film thickness to be deposited. As regards process conditions, the process temperature is set at a constant value of 600° C., and the process pressure is set at 27 Pa (0.2 Torr) in the simultaneous supply period T1 and at 532 Pa (4 Torr) in the reformation period T2. The deposition period T1 is set to have a length of, e.g., about 30 seconds, and the reformation period T2 is set to have a length of, e.g., about 60 seconds.

As described above, when a silicon nitride film is formed, a carbon hydride gas, such as $C_2H_4$ gas, is supplied into the process chamber 8, so that a silicon nitride film formed on the wafer surface is caused to contain carbon components. In this case, although the film formation temperature is set at, e.g., 600° C., which is lower than the conventional film formation temperature of, e.g., about 760° C., it is possible to decrease the etching rate of the silicon nitride film relative to dilute hydrofluoric acid used in a cleaning process or etching process performed on the surface of the film. As a result, the silicon nitride film is not excessively etched by cleaning, and thus the cleaning process is performed with high controllability in the film thickness. Further, the silicon nitride film can sufficiently serve as an etching stopper film.

Furthermore, in the first and second embodiments, HCD gas is intermittently supplied to form the reformation period T2. The surface of a silicon nitride film, formed immediately before the reformation period T2, is reformed in the reformation period T2, thereby improving the film quality. Consequently, the etching rate of the silicon nitride film is further reduced. The effect of the reformation process at an atomic level is thought to be as follows.

Specifically, when a silicon nitride film containing carbon atoms is formed, some of the Cl atoms derived from HCD gas are not desorbed but bonded in an activated state to the uppermost surface of this thin film. During the reformation period T2 of stopping supply of HCD gas, C atoms and N atoms derived from $C_2H_4$ gas and $NH_3$ gas replace Cl atoms on the uppermost surface of the thin film, and reduce Cl components in the film, thereby decreasing the etching rate. Particularly, where $C_2H_4$ gas is used, the number of C atoms taken into the silicon nitride film is increased, thereby further decreasing the etching rate.

Furthermore, where gases, such as HCD gas, are intermittently supplied, the gas consumption amount is reduced, as compared to a case where gases, such as ammonia, HCD, and ethane, are simultaneously continuously supplied for a long time. In this case, inter-substrate and planar uniformities in film thickness are also improved.

[Experiment: Dependency on Gas Supply Pattern]

Next, an explanation will be given of an experiment performed using the CVD apparatus 2 shown in FIG. 1, in relation to the first and second embodiments. In this experiment, a silicon nitride film was formed in accordance with the gas supply patterns of the first and second embodiments shown in FIGS. 2A and 2B and the prior art shown in FIG. 2C, and then the etching rate of the film was examined.

In present examples E11 and E21 according to the first and second embodiments, respectively, the process temperature was set at 600° C., the flow rate of $NH_3$ gas at 600 sccm, the flow rate of HCD gas at 20 sccm, and the flow rate of $C_2H_4$ gas at 600 sccm. The length of the deposition period T1 shown in FIGS. 2A and 2B was set at 30 seconds, and the length of the reformation period T2 at 60 seconds. The process pressure of the deposition period T1 was set at 27 Pa (0.2 Torr), and the process pressure of the reformation period T2 at 532 Pa (4 Torr). Under the conditions described above, a silicon nitride film containing carbon was formed in the present examples E11 and E21.

In a comparative example C1 according to the prior art, the process temperature was set at 600° C., the process pressure at 27 Pa (0.2 Torr), the flow rate of $NH_3$ gas at 600 sccm, and the flow rate of HCD gas at 20 sccm. In this case, $NH_3$ gas and HCD gas were continuously supplied while no $C_2H_4$ gas was supplied. Under the conditions described above, a silicon nitride film containing no carbon was formed in the comparative example C1.

Each of the films formed according to the present examples E11 and E21 and comparative example C1 was immersed in and etched by an etching solution. The etching solution consisted of 0.1%-HF solution (99.9%-$H_2O$), the etching temperature was set at a room temperature, and the length of the etching time at 30 seconds.

FIG. 3A is a graph showing and comparing the etching rate of the films formed by the present examples E11 and E21 and comparative example C1, obtained in this experiment. As shown in FIG. 3A, the comparative example C1 rendered a very large etching rate of 3.41 nm/min. On the other hand, the present examples E11 according to the first embodiment rendered an etching rate of 0.97 nm/min, and the present examples E21 according to the second embodiment rendered an etching rate of 0.60 nm/min. Specifically, the etching rate was far lower in the present examples E11 and E21 than in the comparative example C1.

The etching rate was lower in the present examples E21 than in the present examples E11, the reason for which is thought to be as follows. Specifically, in the present example E21 according to the second embodiment, the reformation period T2 was arranged to stop supply of $NH_3$ gas and HCD gas, and perform only supply of $C_2H_4$ gas. In this case, the partial pressure of $C_2H_4$ gas increased by that much, and thus Cl atoms on the uppermost surface of the silicon nitride film were efficiently replaced with carbon components derived from $C_2H_4$ gas. As a result, the carbon content in the silicon nitride film increased, thereby further decreasing the etching rate.

[Experiment: Dependency on $NH_3$ Gas Flow Rate]

In order to examine the dependency of the etching rate of a silicon nitride film on the flow rate of $NH_3$ gas, an additional experiment was performed using the gas supply pattern according to the first embodiment.

In a present example E12 according to the first embodiment, the silicon nitride film was formed while the flow rate of $NH_3$ gas was set at a smaller value of 100 sccm, and then the etching rate of the film was examined. The other process conditions and etching conditions were set to be the same as those described with reference to FIG. 3A.

FIG. 3B is a graph showing the etching rate of the film formed by the present example E12 obtained in this experiment, and comparing it with the etching rate of the films formed by the present examples E11 (the flow rate of $NH_3$ gas was 600 sccm) and comparative example C1 described above. As shown in FIG. 3B, with the decrease in the flow rate of $NH_3$ gas from 600 sccm (in the present example E11) to 100 sccm (in the present example E12), the etching rate was decreased from 0.97 nm/min to 0.75 nm/min. Accordingly, it has been found that decrease in the $NH_3$ gas is effective to some extent, but is not more effective than the gas supply pattern according to the second embodiment.

[Other Examined Matters]

By examining the length of the deposition period T1 and reformation period T2, the following matters have been found. Specifically, the deposition period T1 is preferably set to have a length within a range of 15 to 60 seconds, and more preferably within a range of 15 to 30 seconds. If the deposition period T1 is shorter than 15 seconds, the silicon nitride film cannot be sufficiently deposited, and it takes long time to reach a target film thickness, which is not practical in light of throughput. Conversely, if the deposition period T1 is longer than 60 seconds, the amount of the Cl element taken into the silicon nitride film becomes too large, which hinders the reformation process from being sufficiently performed.

On the other hand, the reformation period T2 is preferably set to have a length of not less than the length of the deposition period T1. Specifically, the reformation period T2 is preferably set to have a length within a range of 30 to 180 seconds, and more preferably within a range of 30 to 60 seconds. If the reformation period T2 is shorter than 30 seconds, $NH_3$, HCD, and $C_2H_4$ gases cannot be sufficiently removed, or the reformation process cannot be sufficiently performed. Conversely, if the reformation period T2 is longer than 180 seconds, one cycle becomes too long, which is not practical in light of throughput.

Further, by examining the process temperature, the following matters have been found. Specifically, the process temperature is preferably set to be within a range of 450 to 600° C. If the process temperature is higher than 600° C., various thin films formed on a wafer W prior to formation of the silicon nitride film may suffer thermal damage. Conversely, if the process temperature is lower than 450° C., the silicon nitride film cannot be sufficiently formed by thermal CVD.

Third Embodiment

FIGS. 4A and 4B are timing charts showing gas supply patterns according to a third embodiment of the present invention and a modification thereof, respectively. According to the third embodiment shown in FIG. 4A, $NH_3$ gas is continuously supplied, while $C_2H_4$ gas used as a carbon hydride gas is intermittently supplied, in synchronism with HCD gas being intermittently supplied. According to the modification of the third embodiment shown in FIG. 4B, $NH_3$ gas is continuously supplied, while $C_2H_4$ gas used as a carbon hydride gas is intermittently supplied, in a cycle reverse to HCD gas being intermittently supplied. Specifically, as shown in FIG. 4B, supply of $C_2H_4$ gas is performed in the reformation period T2, and is stopped in the deposition period T1.

<Matters Common to First to Third Embodiments>

In the first to third embodiments, the carbon hydride gas is exemplified by $C_2H_4$ (ethylene). In this respect, the carbon hydride gas may be one or more of gases selected from the group consisting of acetylene, ethylene, methane, ethane, propane, and butane. For example, where the carbon hydride gas is ethane, this gas is preferably pre-heated to about 500 to 1,000, and then supplied into the process chamber 8.

Fourth Embodiment

As described above, according to the first to third embodiments, in order to decrease the etching rate, when a silicon nitride film is formed, a carbon hydride gas, such as $C_2H_4$ gas, is supplied to cause the silicon nitride film to contain carbon components. In this respect, as described below, when a silicon nitride film is formed, in place of supplying a carbon hydride gas, a silane family gas may be intermittently supplied to decrease the etching rate.

FIG. 5 is a timing chart showing a gas supply pattern according to a fourth embodiment of the present invention. As shown in FIG. 5, according to this embodiment, no carbon hydride gas is supplied, and ammonia gas is continuously supplied while HCD gas used as a silane family gas is intermittently supplied. In this case, a deposition period T1 is defined by a period of simultaneously supplying both the gases, and a reformation period T2 is defined by a period of performing only supply of $NH_3$ gas and stopping supply of HCD gas. This film formation process may be easily realized by the film formation apparatus shown in FIG. 1, if the carbon hydride gas supply circuit 46 is completely shut off.

The fourth embodiment is not arranged to cause the silicon nitride film to contain carbon atoms. However, a thin silicon nitride film deposited in the deposition period T1 is reformed with $NH_3$ gas in the reformation period T2 immediately thereafter, so that Cl atoms on the uppermost surface are replaced with N atoms. Consequently, the etching rate of a silicon nitride film obtained at the end is decreased.

[Experiment: Dependency on Deposition Period]

Next, an explanation will be given of an experiment performed using the CVD apparatus 2 shown in FIG. 1, in relation to the fourth embodiment. In this experiment, a silicon nitride film was formed in accordance with the gas supply patterns of the fourth embodiment shown in FIG. 5 and the prior art shown in FIG. 2C, and then the etching rate of the film was examined.

In present examples E41, E42, and E43 according to the fourth embodiment, the process temperature was set at 600° C., the flow rate of $NH_3$ gas at 900 sccm, and the flow rate of HCD gas at 30 sccm. The length of the reformation period T2 shown in FIG. 5 was set at a constant value of 60 seconds, and the length of the deposition period T1 was set at different values of 60 seconds, 30 seconds, and 15 seconds in the present examples E41, E42, and E43, respectively. The process pressure of the deposition period T1 was set at 27 Pa (0.2 Torr), and the process pressure of the reformation period T2 at 532 Pa (4 Torr).

In a comparative example C1 according to the prior art, the process temperature was set at 600° C., the process pressure at 27 Pa (0.2 Torr), the flow rate of $NH_3$ gas at 600 sccm, and the flow rate of HCD gas at 20 sccm. In this case, $NH_3$ gas and HCD gas were continuously supplied while no $C_2H_4$ gas was supplied. Specifically, this comparative example C1 is the same as the comparative example C1 described with reference to FIG. 3A.

Each of the films formed according to the present examples E41, E42, and E43 and comparative example C1 was immersed in and etched by an etching solution. The etching solution consisted of 0.1%-HF solution (99.9%-$H_2O$), the etching temperature was set at a room temperature, and the length of the etching time at 30 seconds.

FIG. 6A is a graph showing and comparing the etching rate of the films formed by the present examples E41, E42, and E43 and comparative example C1, obtained in this experiment. In terms of the etching rate, as shown in FIG. 6A, the comparative example C1 rendered a very large etching rate of 3.41 nm/min. On the other hand, the present example E41 (the deposition period T1 was 60 seconds) rendered an etching rate of 3.1 nm/min, which was slightly lower than that of the comparative example C1 (a small effect was produced). The present examples E42 and E43 (the deposition period T1 was 30 seconds and 15 seconds, respectively) rendered further lower etching rates of 2.28 nm/min and 1.8 nm/min, respectively (a large effect was produced). Accordingly, it has been found that the deposition period T1 is preferably set to have a length of 30 seconds or less to sufficiently decrease the etching rate of a silicon nitride film, as compared to the prior art.

[Experiment: Dependency on Reformation Period]

In order to examine the dependency of the etching rate of a silicon nitride film on the length of the reformation period T2, an additional experiment was performed using the gas supply pattern according to the fourth embodiment.

In a present example E44 according to the fourth embodiment, the length of the deposition period T1 was set at 30 seconds, and the length of the reformation period T2 at 180 seconds. The other process conditions and etching conditions were set to be the same as those described with reference to FIG. 6A.

FIG. 6B is a graph showing the etching rate of the film formed by the present example E44 obtained in this experiment, and comparing it with the etching rate of the films formed by the present example E42 (the deposition period T1 was 30 seconds, and the reformation period T2 was 60 seconds) and comparative example C1 described above. As shown in FIG. 6B, the present example E42 (the reformation period T2 was 60 seconds) rendered an etching rate of 2.28 nm/min, while the present example E44 (the reformation period T2 was 180 seconds) rendered an etching rate of 2.16 nm/min. Specifically, the etching rate did not change so much with the increase in the reformation period T2 from 60 seconds to 180 seconds.

Judging from the experimental results described above, the deposition period T1 is preferably set to have a length of 30 seconds or less, and the reformation period T2 is preferably set to have a length of 60 seconds or more, to sufficiently decrease the etching rate of a silicon nitride film, as compared to the prior art.

Fifth to Eighth Embodiments

As described above, according to the first to fourth embodiments, at least HCD gas used as a silane family gas is intermittently supplied, and at least one of the other gases, i.e., ammonia gas and ethylene used as a carbon hydride gas is continuously supplied. Alternatively, all the gases, i.e., the ammonia gas, silane family gas, and carbon hydride gas, may be respectively intermittently supplied (pulse-wise). In this case, as shown in the fifth to eighth embodiments, at least one of the silane family gas and carbon hydride gas is first supplied in each cycle of gas supply.

FIGS. 7A, 7B, 7C, and 7D are timing charts showing gas supply patterns according to fifth, sixth, seventh, and eighth embodiments of the present invention, respectively.

Figure 7A:
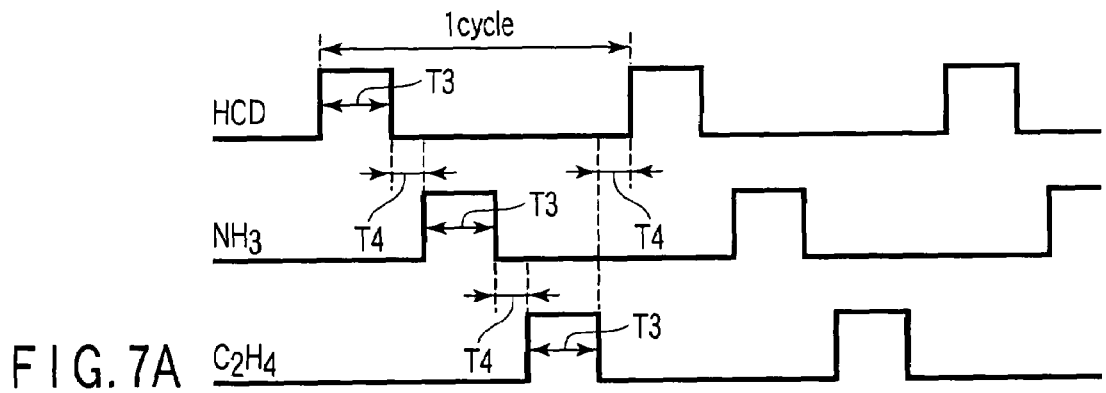
FIGS. 7A, 7B, 7C, and 7D are timing charts showing gas supply patterns according to fifth, sixth, seventh, and eighth embodiments of the present invention, respectively.

According to the fifth embodiment shown in FIG. 7A, the supply periods (or supply timing) of the gases of three types are set to be different in timing from each other. Specifically, one cycle of first supplying HCD gas, then supplying $NH_3$ gas, and then supplying $C_2H_4$ gas is continuously repeated a plurality of times. One gas supply period T3 (one pulse) is set to have a length of, e.g., about 1 minute. One recess period T4 between two adjacent supply periods of different gases is set to have a length of, e.g., about 0.5 minutes.

Accordingly, in the fifth embodiment, one cycle length is about 4.5 minutes. The recess period serves as a film reformation period, and the interior of the process chamber is vacuum-exhausted over all the periods of film formation, as in the first to fourth embodiments. During the recess period (reformation period), supply of the gases of three types is stopped and only vacuum-exhaust is continued. Alternatively, during the recess period (reformation period), supply of an inactive gas, such as $N_2$ gas, may be performed while supply of the gases of three types is stopped and vacuum-exhaust is continued. This matter is common to the sixth to eighth embodiments described below.

Figure 7B:
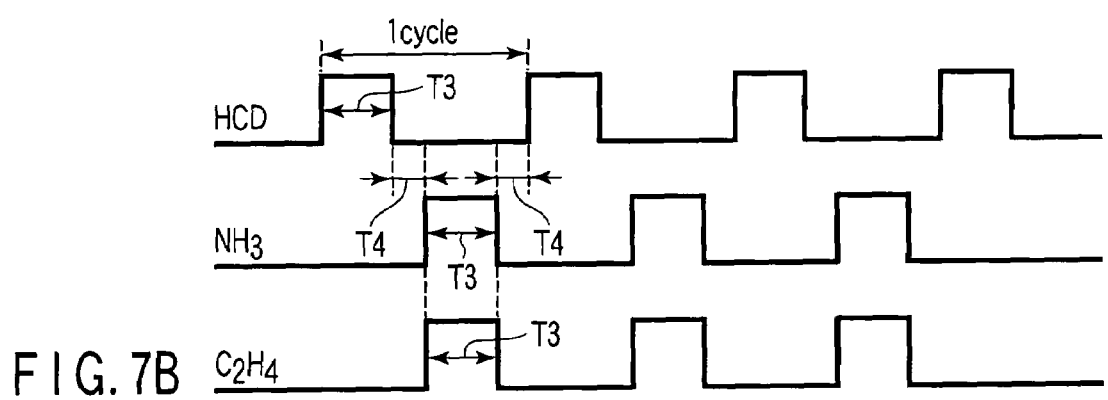

According to the sixth embodiment shown in FIG. 7B, the supply periods of ammonia gas and $C_2H_4$ gas are set to be the same in timing, i.e., these two gases are supplied together in synchronism with each other. Specifically, one cycle of first supplying HCD gas and then supplying $NH_3$ gas and $C_2H_4$ gas together is continuously repeated a plurality of times. One gas supply period T3 (one pulse) is set to have a length of, e.g., about 1 minute. One recess period T4 is set to have a length of, e.g., about 0.5 minutes. Accordingly, in the sixth embodiment, one cycle length is about 3 minutes.

Figure 7C:
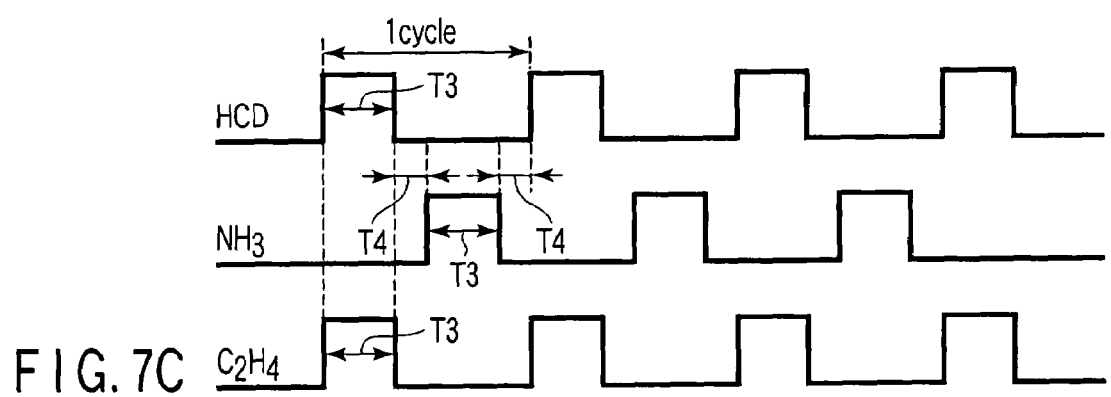

According to the seventh embodiment shown in FIG. 7C, the supply periods of HCD gas and $C_2H_4$ gas are set to be the same in timing, i.e., these two gases are supplied together in synchronism with each other. Specifically, one cycle of first supplying HCD gas and $C_2H_4$ gas together and then supplying $NH_3$ gas is continuously repeated a plurality of times. One gas supply period T3 (one pulse) is set to have a length of, e.g., about 1 minute. One recess period T4 is set to have a length of, e.g., about 0.5 minutes. Accordingly, in the seventh embodiment, one cycle length is about 3 minutes.

Figure 7D:
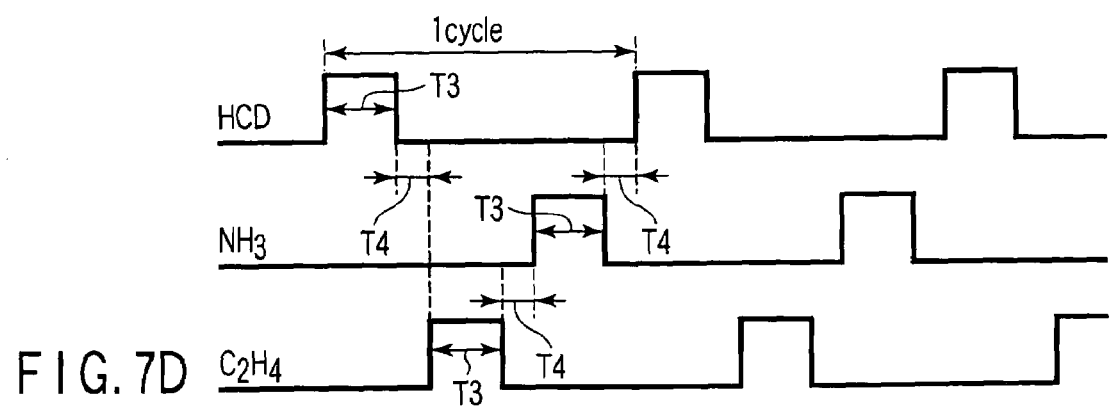

According to the eighth embodiment shown in FIG. 7D, the supply periods (or supply timing) of the gases of three types are set to be different in timing from each other. Specifically, one cycle of first supplying HCD gas, then supplying $C_2H_4$ gas, and then supplying $NH_3$ gas is continuously repeated a plurality of times. That is, the eighth embodiment adopts an order of supply of $C_2H_4$ gas and $NH_3$ gas, reverse to that of the fifth embodiment shown in FIG. 7A. One gas supply period T3 (one pulse) is set to have a length of, e.g., about 1 minute. One recess period T4 between two adjacent supply periods of different gases is set to have a length of, e.g., about 0.5 minutes. Accordingly, in the eighth embodiment, one cycle length is about 4.5 minutes.

In the fifth to eighth embodiments, HCD gas is first supplied alone or simultaneously with $C_2H_4$ gas, and then $NH_3$ gas is supplied in each cycle of gas supply. This is adopted because, if $NH_3$ gas is first supplied, N—Si bonds, which are low in chemical resistance (easily etched), are formed on the wafer surface. In order to prevent this problem, HCD gas is first supplied alone or simultaneously with $C_2H_4$ gas, so that Si—C bonds, which are high in chemical resistance (hardly etched), are formed. In other words, for a target substrate having a silicon surface, a process gas containing C is first supplied to form Si—C bonds on the silicon surface, thereby protecting the surface.

[Experiment: Dependency on Gas Supply Pattern]

Next, an explanation will be given of an experiment performed using the CVD apparatus 2 shown in FIG. 1, in relation to the fifth to eighth embodiments. In this experiment, a silicon nitride film was formed in accordance with the gas supply patterns of the fifth to eighth embodiments shown in FIGS. 7A to 7D and the prior art shown in FIG. 2C, and then the etching rate of the film was examined.

In present examples E51, E61, E71, and E81 according to the fifth to eighth embodiments, respectively, the process temperature was set at 500° C., the flow rate of $NH_3$ gas at 600 sccm, the flow rate of HCD gas at 20 sccm, and the flow rate of $C_2H_4$ gas at 600 sccm. The length of the supply period T3 shown in FIGS. 7A to 7D was set at 30 seconds, and the length of the recess period T4 at 60 seconds. The number of cycles performed in film formation was set at 50. The process pressure of the supply period T3 for each gas was set at 0.6 Torr (80 Pa). During the recess period T4, supply of all the gases is stopped and only vacuum-exhaust was continued (with a base pressure of 0.002 to 0.004 Torr).

In comparative examples C2 and C3 according to the prior art, the flow rate of $NH_3$ gas was set at 600 sccm, and the flow rate of HCD gas at 20 sccm. In this case, $NH_3$ gas and HCD gas were continuously supplied while no $C_2H_4$ gas was supplied. The process pressure was set at different values of 80 Pa (0.6 Torr) and 27 Pa (0.2 Torr) in the comparative examples C2 and C3, respectively. The process temperature was set at different values of 500° C. and 600° C. in the comparative examples C2 and C3, respectively.

Each of the films formed according to the present examples E51, E61, E71, and E81 and comparative examples C2 and C3 was immersed in and etched by an etching solution. The etching solution consisted of 0.1%-HF solution (99.9%-$H_2O$), the etching temperature was set at a room temperature, and the length of the etching time at 1 minute.

Figure 8:
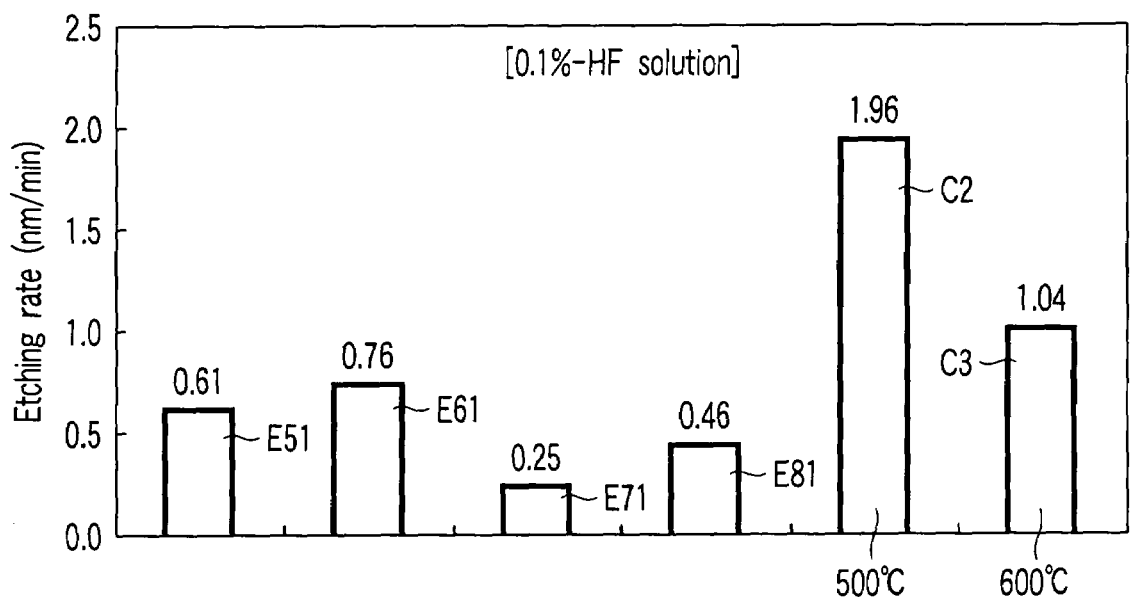
FIG. 8 is a graph showing the dependency of the etching rate of a silicon nitride film on the gas supply pattern, in relation to the fifth to eighth embodiments.

FIG. 8 is a graph showing and comparing the etching rate of the films formed by the present examples E51, E61, E71, and E81 and comparative examples C2 and C3, obtained in this experiment. As shown in FIG. 8, the present examples E51, E61, E71, and E81 rendered etching rates of 0.61 nm/min, 0.76 nm/min, 0.25 nm/min, and 0.46 nm/min, respectively. These values were far lower than etching rates of 1.96 nm/min and 1.04 nm/min obtained by the comparative examples C2 and C3. Specifically, the present examples E51, E61, E71, and E81 improved the film quality, as compared to the comparative examples C2 and C3. Particularly, the present examples E71 and E81 according to the seventh and eighth embodiments rendered very low etching rates of less than 0.5 nm/minor, which represented remarkable improvement in the film quality.

Accordingly, it has been found that, even where all the gases of three types are intermittently supplied pulse-wise, the surface of a silicon nitride film is reformed, so the film quality is improved and the etching rate is further decreased.

[Experiment: Dependency on Process Pressure]

In order to examine the dependency of the etching rate of a silicon nitride film on the process pressure during gas supply, an additional experiment was performed using the gas supply pattern according to the fifth embodiment.

In a present example E52 according to the fifth embodiment, the process pressure during gas supply was set at 1.0 Torr (133 Pa). The other process conditions and etching conditions were set to be the same as those described with reference to FIG. 8.

Figure 9:
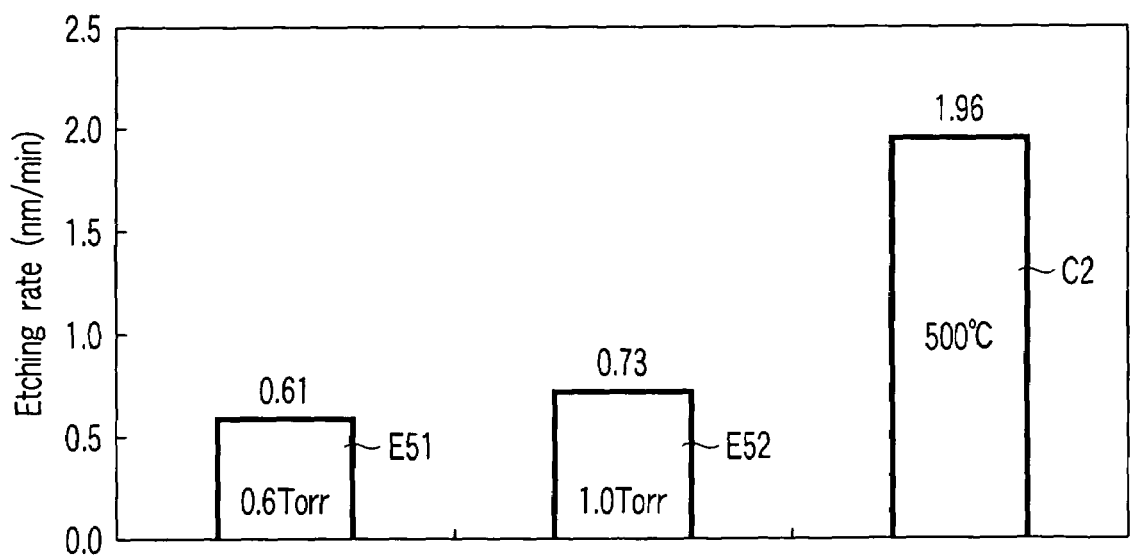
FIG. 9 is a graph showing the dependency of the etching rate of a silicon nitride film on the process pressure, in relation to the fifth embodiment.

FIG. 9 is a graph showing the etching rate of the film formed by the present example E52 obtained in this experiment, and comparing it with the etching rate of the films formed by the present examples E51 (the process pressure during gas supply was set at 0.6 Torr (80 Pa) and comparative example C2 described above. As shown in FIG. 9, the present examples E51 (the process pressure was 0.6 Torr) rendered an etching rate of 0.61 nm/min, and the present examples E52 (the process pressure was 1.0 Torr) rendered an etching rate of 0.73 nm/min. Accordingly, it has been found that the etching rate does not so much depend on the process pressure during gas supply, and the film quality is sufficiently improved as long as the pressure is set to be 1 Torr or less.

[Experiment: Dependency on Recess Period Pressure]

In order to examine the dependency of the etching rate of a silicon nitride film on the pressure of the recess period T4, an additional experiment was performed using the gas supply pattern according to the fifth embodiment.

In a present example E53 according to the fifth embodiment, during the recess period T4, $N_2$ gas used as an inactive gas was supplied while vacuum-exhausted was performed to set the pressure inside the process chamber at 0.6 Torr. The other process conditions and etching conditions were set to be the same as those described with reference to FIG. 8.

Figure 10:
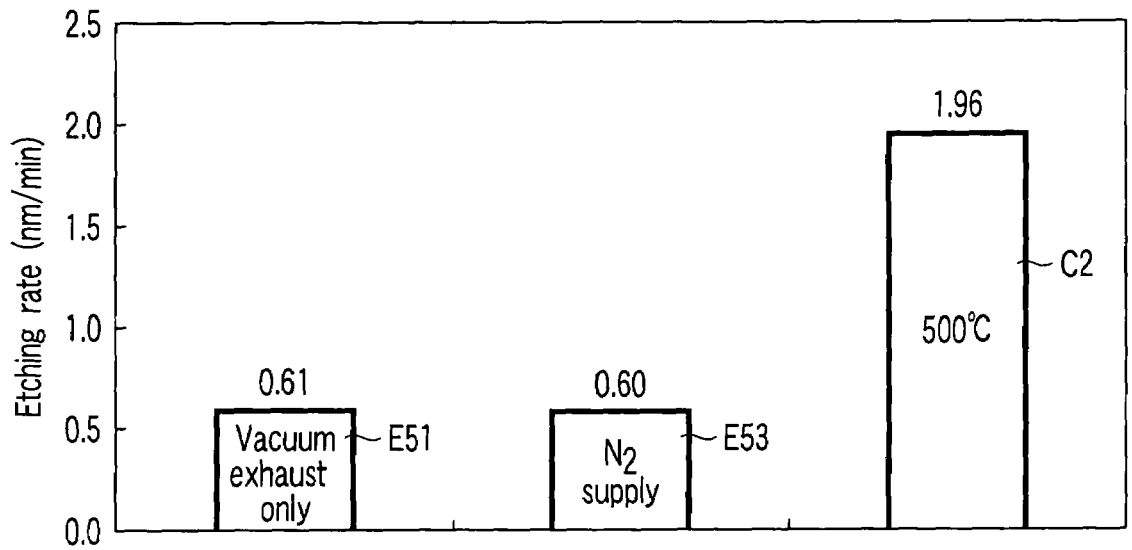
FIG. 10 is a graph showing the dependency of the etching rate of a silicon nitride film on the recess period pressure, in relation to the fifth embodiment.

FIG. 10 is a graph showing the etching rate of the film formed by the present example E53 obtained in this experiment, and comparing it with the etching rate of the films formed by the present examples E51 (only vacuum-exhaust was performed during the recess period T4 (with a base pressure of 0.002 to 0.004 Torr)) and comparative example C2 described above. As shown in FIG. 10, the present examples E51 (only vacuum-exhaust was performed during the recess period T4) rendered an etching rate of 0.61 nm/min, and the present examples E53 (N₂ supply and vacuum-exhaust were performed during the recess period T4) rendered an etching rate of 0.60 nm/min. Accordingly, it has been found that the etching rate is not affected by the pressure of the recess period T4 (N₂ supply). In other words, the recess period T4 requires only vacuum-exhaust, and does not necessarily require supply of an inactive gas (N₂ gas).

[Experiment: Planar Uniformity in Film Thickness]

Further, an examination was performed on the relationship between planar uniformity in the film thickness of a silicon nitride film and gas supply patterns according to the fifth to eighth embodiments. In this experiment, the film thickness of silicon nitride films formed by the present examples E51, E61, E71, and E81 and comparative example C2 was measured for wafers at top, central, and bottom positions of the wafer boat.

Figure 11:
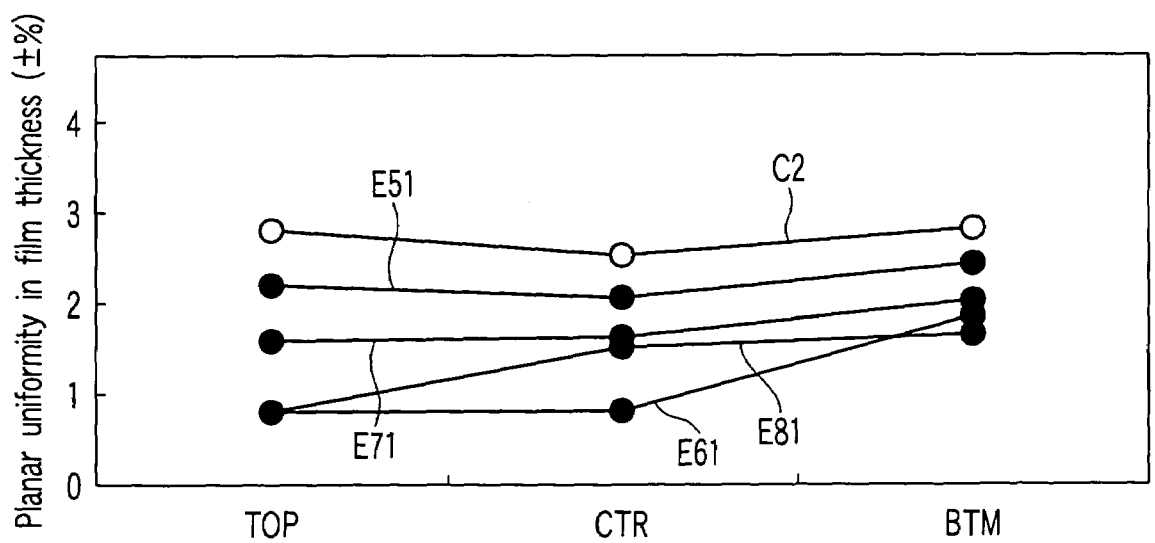
FIG. 11 is a graph showing the relationship between the gas supply pattern and the planar uniformity in the film thickness of a silicon nitride film, in relation to the fifth to eighth embodiments.

FIG. 11 is a graph showing the film thickness of the silicon nitride films formed by the present examples E51, E61, E71, and E81 and comparative example C2, obtained in this experiment. In FIG. 11, "TOP", "CTR", and "BTM" denote wafers at top, central, and bottom positions of the wafer boat, respectively. As shown in FIG. 11, as regards the planar uniformity of the film thickness, all the present examples E51, E61, E71, and E81 rendered better results (the film thickness difference in the planar direction was smaller) than the comparative example C2. Further, inter-substrate uniformity in the film thickness was also examined. As a result, all the present examples E51, E61, E71, and E81 rendered better results (the film thickness difference between substrates was smaller) than the comparative example C2.

In the experiments in relation to the fifth to eighth embodiments, the etching rate of a silicon nitride film was examined using an etching solution consisting of 0.1%-HF solution (99.9%-H₂O). An additional experiment was also performed of etching a silicon nitride film, using a high concentration solution of 1.0%-HF (99%-H₂O). As a result, the comparative example C2 (the process temperature was 500° C.) rendered an etching rate of 14.0 nm/min, while the present examples E51 rendered a very small etching rate of 0.65 nm/min. Specifically, it has been confirmed that the fifth to eighth embodiments are still effective even where the etching solution was changed as described above. The values described above in relation to the supply period T3 and recess period T4 of the fifth to eighth embodiments are merely examples and are not limiting.

<Matters Common to First to Eighth Embodiments>

In the embodiments described above, the silane family gas used for forming a silicon nitride film is exemplified by hexachlorodisilane (HCD). In this respect, the silane family gas used for forming a silicon nitride film may comprise one or more gases selected from the group consisting of hexachlorodisilane (HCD), monosilane (SiH₄), disilane (Si2H6), dichlorosilane (DCS), hexaethylaminodisilane, hexamethyldisilazane (HMDS), tetrachlorosilane (TCS), disilylamine (DSA), trisilylamine (TSA), and bistertialbutylaminosilane (BTBAS).

In the embodiments described above, the CVD apparatus is exemplified by a vertical apparatus of the batch type. However, the present invention may be applied to a horizontal apparatus of the batch type, or a CVD apparatus of the single-substrate type that processes target substrates one by one. The target substrate according to the present invention is not limited to a semiconductor wafer, and it may be another substrate, such as an LCD substrate or glass substrate.

The invention claimed is:

1. A CVD method for forming a silicon nitride film on a target substrate by repeating a predetermined cycle a plurality of times to laminate thin films formed by respective times, thereby arriving at a silicon nitride film having a target thickness, in a process chamber configured to be selectively supplied with a silicon source gas including chlorine, ammonia gas, and ethylene gas, the predetermined cycle, in order, comprising:
   a first step of supplying the silicon source gas and the ethylene gas to the process chamber while maintaining supply of the ammonia gas to the process chamber in a shut off state;
   a second step of maintaining supply of the silicon source gas, the ammonia gas, and the ethylene gas to the process chamber in a shut off state;
   a third step of supplying the ammonia gas to the process chamber while maintaining supply of the silicon source gas and the ethylene gas to the process chamber in a shut off state; and
   a fourth step of maintaining supply of the silicon source gas, the ammonia gas, and the ethylene gas to the process chamber in a shut off state, in this order, while exhausting gas from inside the process chamber during the first to fourth steps.

2. The method according to claim 1, wherein the second and fourth steps comprise performing supply of an inactive gas to the process chamber.

3. The method according to claim 1, wherein the first and third steps are arranged to use a process pressure of 133 Pa (1 Torr) or less.

4. The method according to claim 1, wherein the first to fourth steps are arranged to use a process temperature of 450 to 600° C.

5. The method according to claim 1, wherein the silicon source gas comprises one or more gases selected from the group consisting of hexachlorodisilane, dichlorosilane, and tetrachlorosilane.

6. The method according to claim 5, wherein the silicon source gas is hexachiorodisilane.

7. A CVD method for forming a silicon nitride film on a target substrate by repeating a predetermined cycle a plurality of times to laminate thin films formed by respective times, thereby arriving at a silicon nitride film having a target thickness, in a process chamber configured to be selectively supplied with a silicon source gas including chlorine, ammonia gas, and ethylene gas, the predetermined cycle, in order, comprising:
   a first step of supplying of the silicon source gas to the process chamber while maintaining supply of the ammonia gas and the ethylene gas to the process chamber in a shut off state;
   a second step of maintaining supply of the silicon source gas, the ammonia gas, and the ethylene gas to the process chamber in a shut off state;
   a third step of supplying the ethylene gas to the process chamber while maintaining supply of the silicon source gas and the ammonia gas to the process chamber in a shut off state; and
   a fourth step of maintaining supply of the silicon source gas, the ammonia gas, and the ethylene gas to the process chamber in a shut off state,
   a fifth step of supplying of the ammonia gas to the process chamber while maintaining supply of the silicon source gas and the ethylene gas to the process chamber in a shut off state; and a sixth step maintaining supply of the silicon source gas, the ammonia gas, and the ethylene gas to the process chamber in a shut off state, in this order, while exhausting gas from inside the process chamber during the first to sixth steps.

8. The method according to claim 7, wherein the second, fourth, and sixth steps comprise performing supply of an inactive gas to the process chamber.

9. The method according to claim 7, wherein the first, third, and fifth steps are arranged to use a process pressure of 133 Pa (1 Torr) or less.

10. The method according to claim 7, wherein the first to sixth steps are arranged to use a process temperature of 450 to 600° C.

11. The method according to claim 7, wherein the silicon source gas comprises one or more gases selected from the group consisting of hexachlorodisilane, dichlorosilane, and tetrachlorosilane.

12. The method according to claim 11, wherein the silicon source gas is hexachlorodisilane.

* * * * *